(12) United States Patent
Yang

(10) Patent No.: US 8,085,542 B2
(45) Date of Patent: Dec. 27, 2011

(54) HEAT DISSIPATION DEVICE AND ELECTRONIC SYSTEM INCORPORATING THE SAME

(75) Inventor: Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 122 days.

(21) Appl. No.: 12/770,749

(22) Filed: Apr. 30, 2010

(65) Prior Publication Data

US 2011/0149515 A1 Jun. 23, 2011

(30) Foreign Application Priority Data

Dec. 23, 2009 (CN) .......................... 2009 1 0312081

(51) Int. Cl.
*H05K 7/20* (2006.01)
(52) U.S. Cl. ....... 361/719; 361/704; 361/707; 165/80.3; 165/80.4; 174/15.1; 174/15.2; 174/16.1

(58) Field of Classification Search ................. None
See application file for complete search history.

(56) References Cited

U.S. PATENT DOCUMENTS

| 6,125,035 | A * | 9/2000 | Hood et al. | 361/679.47 |
|---|---|---|---|---|
| 7,304,846 | B2 * | 12/2007 | Wang et al. | 361/700 |
| 7,325,590 | B2 * | 2/2008 | Kim et al. | 165/104.33 |
| 7,327,576 | B2 * | 2/2008 | Lee et al. | 361/719 |
| 7,372,702 | B2 * | 5/2008 | Gauche et al. | 361/719 |
| 7,411,791 | B2 * | 8/2008 | Chang et al. | 361/703 |
| 7,511,947 | B2 * | 3/2009 | Leng et al. | 361/679.52 |
| 7,885,075 | B2 * | 2/2011 | Li et al. | 361/701 |
| 7,990,699 | B2 * | 8/2011 | Lian et al. | 361/679.47 |

* cited by examiner

*Primary Examiner* — Boris Chervinsky
(74) *Attorney, Agent, or Firm* — Altis Law Group, Inc.

(57) ABSTRACT

A heat dissipation device for a first electronic component and a second electronic component mounted on a circuit board includes a first base mounted on the first electronic component and a second base mounted on the second electronic component. The second base is movably connected with the first base. An electronic system incorporating the heat dissipation device is also provided.

16 Claims, 6 Drawing Sheets

HEAT DISSIPATION DEVICE AND ELECTRONIC SYSTEM INCORPORATING THE SAME

CROSS-REFERENCE TO RELATED APPLICATION

This application is related to a co-pending application entitled "ELECTRONIC SYSTEM AND HEAT DISSIPATION DEVICE THEREOF" Ser. No. 12/770,750, assigned to the same assignee of this application and filed on the same date as this application.

BACKGROUND

1. Technical Field

The disclosure generally relates to heat dissipation, and particularly to a heat dissipation device for plural electronic components of an electronic system.

2. Description of Related Art

It is well known that heat is generated by electronic components such as integrated circuit chips, during their operation. If the heat is not efficiently removed, the electronic components may suffer damage. Thus, heat dissipation devices are often used to cool the electronic components.

In a typical computer system, more than one electronic component, such as a central processing unit (CPU), a memory control hub (MCH), an input/output (i/o) controller hub (ICH), and others, must be cooled. Since the electronic components are generally of different heights with top surfaces thereof at different levels, a lone conventional heat sink cannot make the required snug contact with the top surfaces of all the components. Accordingly, a plurality of heat pipes is often employed to remove heat from the electronic components. However, if the heat pipes are fully fixed, there is no moveable space to meet product tolerances. This results in contact gaps between the heat pipes and the electronic components. Thus, the heat dissipation efficiency of the heat dissipation device may be adversely affected. Further, if the heat pipes are not fixed, they may deform during transport or assembly.

What is needed, therefore, is a heat dissipation device and an electronic system incorporating the heat dissipation device which can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
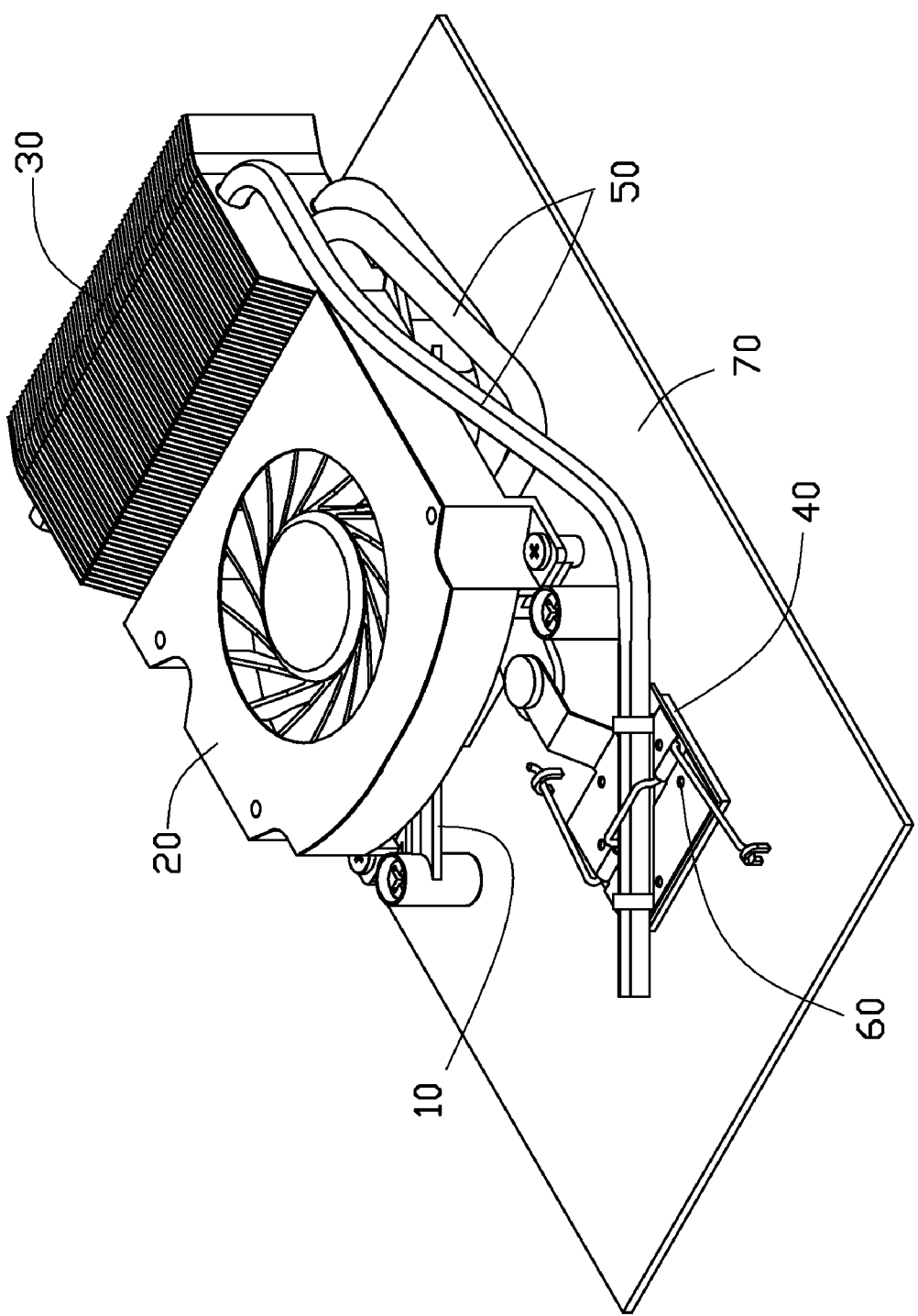
FIG. 1 is an assembled, isometric view of an electronic system in accordance with one embodiment of the disclosure.
Figure 2:
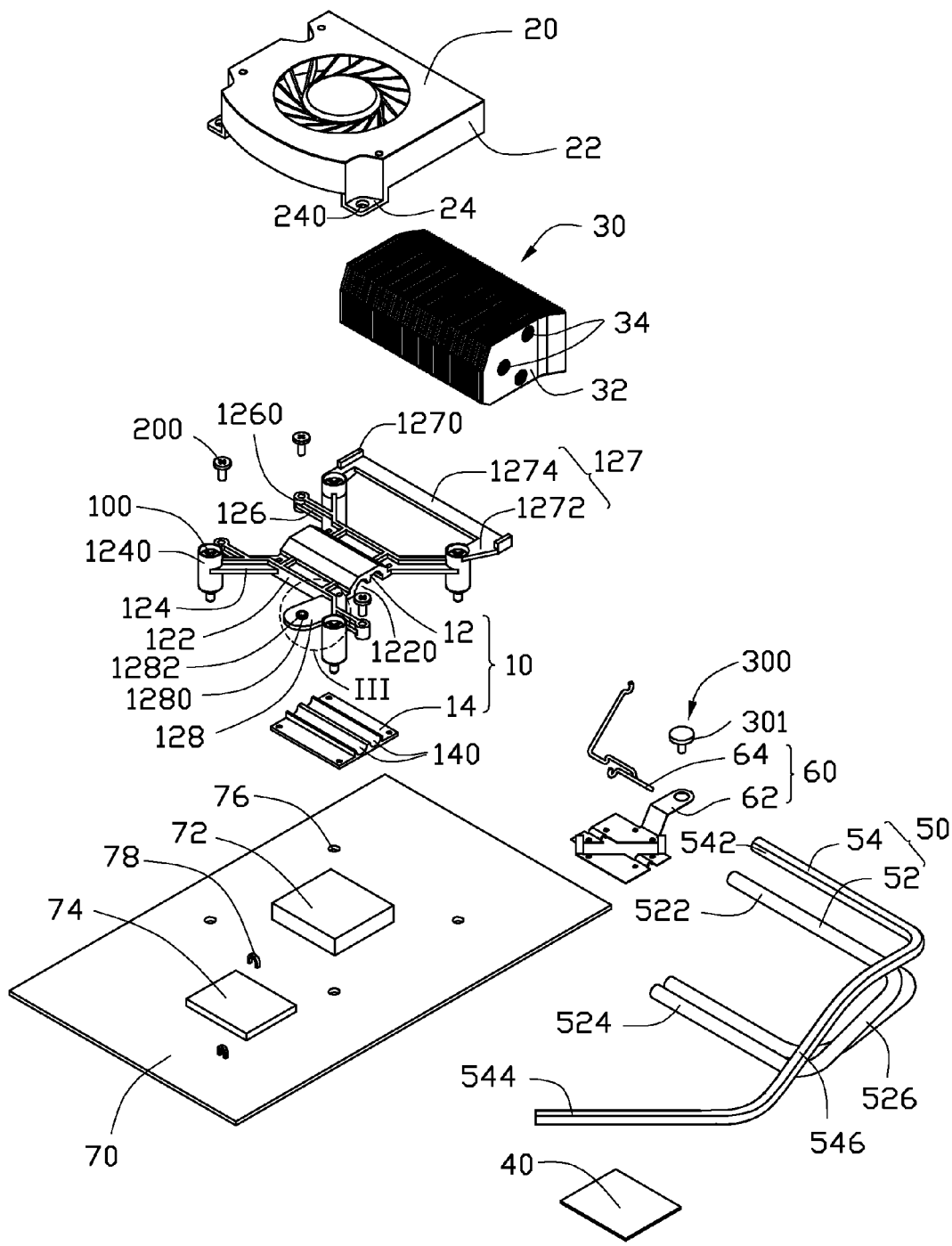
FIG. 2 is an exploded view of the electronic system of FIG. 1.

Referring to FIGS. 1 and 2, an electronic system in accordance with one embodiment of the disclosure is shown. The electronic system includes a circuit board 70, and a heat dissipation device mounted on the circuit board 70. The circuit board 70 supports a first electronic component 72 such as a CPU, and a second electronic component 74 such as an MCH, ICH, or other component. In the illustrative embodiment, the first electronic component 72 generates more heat than the second electronic component 74 during operation. The circuit board 70 defines therein a mounting hole 76 near each corner of the first electronic component 72, and provides a pair of clasps 78 near two diagonally opposite corners of the second electronic component 74. The heat dissipation device includes a first base 10 mounted on the first electronic component 72, a fan 20 located on the first base 10, a fin assembly 30 disposed beside the fan 20, a second base mounted on the second electronic component 74, and a heat pipe assembly 50 thermally connecting the first base 10 and the second base with the fin assembly 30. The second base includes a heat spreader 40, and a fastening assembly 60 fixing the heat spreader 40 onto the second electronic component 74.

The first base 10 includes a mounting rack 12, and a rectangular bottom plate 14 at a bottom of the mounting rack 12. The bottom plate 14 is made of metal or metal alloy with a high heat conductivity coefficient, such as copper, copper-alloy, or other suitable material. The bottom plate 14 is attached to the first electronic component 72 of the circuit board 70. The bottom plate 14 defines a plurality of parallel and spaced receiving grooves 140 in a top surface thereof, for receiving the heat pipe assembly 50. The mounting rack 12 includes a rectangular top plate 122 and four fixing legs 124 extending outwardly from four corners of the top plate 122, respectively. The top plate 122 defines a plurality of parallel and spaced receiving grooves 1220 in a bottom surface thereof, corresponding to the receiving grooves 140 of the bottom plate 14. The top plate 122 arches at a middle thereof, corresponding to the receiving grooves 1220. Two lateral sides of the top plate 122 are thinner than the arched portion of the top plate 122, for saving material and reducing the weight of the first base 10. Each of the fixing legs 124 forms a mounting sleeve 1240 at a distal end thereof. Four fasteners 100 extend respectively through the mounting sleeves 1240 of the fixing legs 124, for mounting the heat dissipation device on the circuit board 70. Three of the fixing legs 124 each include a fixing arm 126 extending outwardly from a lateral side thereof. The fixing arm 126 is parallel to the receiving grooves 1220, and defines an internally threaded sleeve 1260 at a distal end thereof.

Figure 3:
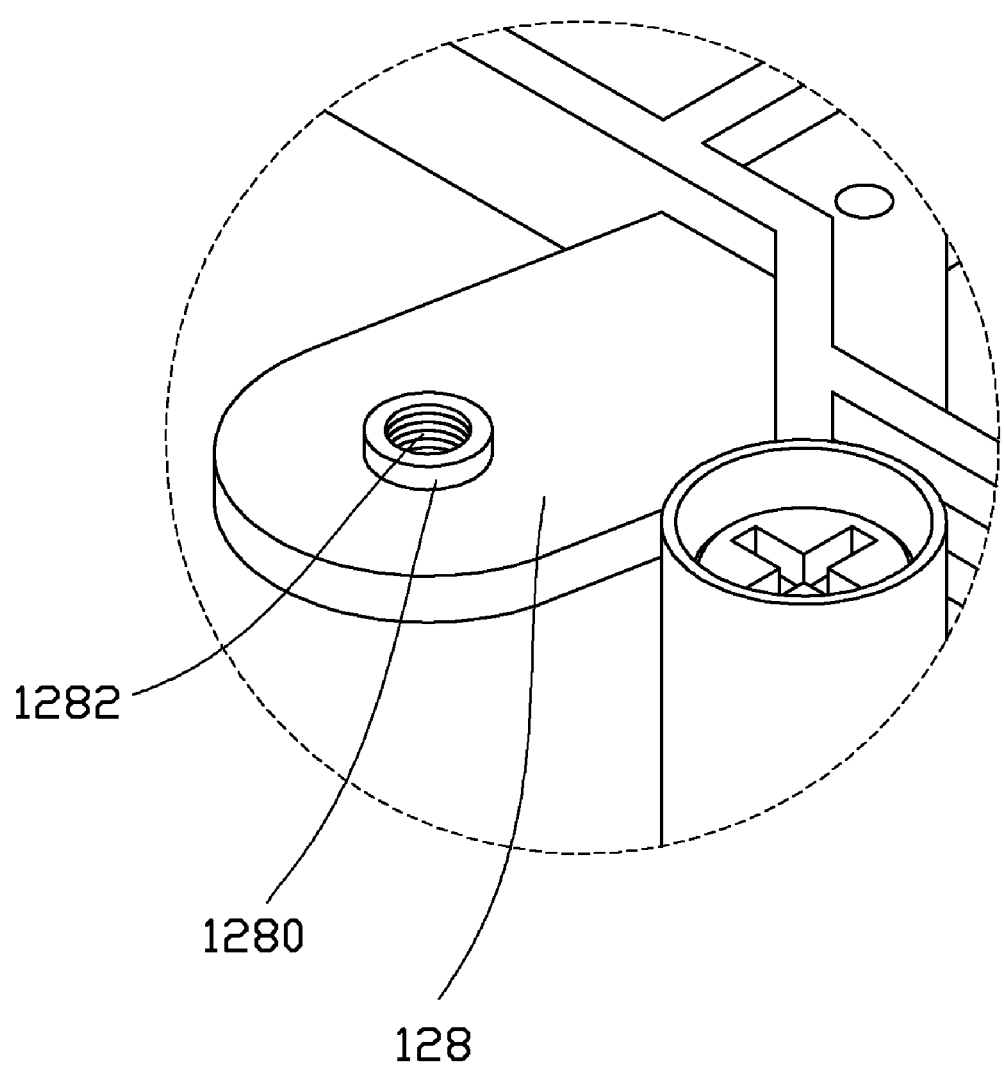
FIG. 3 is an enlarged view of a circled portion III of the electronic system shown in FIG. 2.

The mounting rack 12 further includes a bracket 127 and an orienting portion 128, which are at opposite sides of the top plate 122, respectively. The bracket 127 is located away from the second electronic component 74. The bracket 127 includes two extension arms 1272 extending respectively from outer circumferential surfaces of two adjacent mounting sleeves 1240 of the fixing legs 124, and a support plate 1274 connecting two free ends of the extension arms 1272. A pair of tabs 1270 extend perpendicularly upward from opposite ends of the support plate 1274, respectively. The orienting portion 128 extends from the top plate 122 toward the second electronic component 74, and is perpendicular to the receiving grooves 1220. Referring also to FIG. 3, in the present embodiment, the orienting portion 128 is an elongated rectangular plate. The orienting portion 128 includes an annular collar 1280 extending perpendicularly upward from a distal end of a main body thereof. The collar 1280 defines an orienting hole 1282 therein.

The fan 20 is a centrifugal blower, and directs airflow toward the fin assembly 30. The fan 20 includes a substantially rectangular housing 22. The housing 22 includes three ears 24 extending out from a bottom end thereof, corresponding to the fixing arms 126, respectively. Each of the ears 24 defines a fixing hole 240 therethrough. A fastener 200 extends through the fixing hole 240 of each ear 24 and is received in the internally threaded sleeve 1260, the fasteners 200 thereby securing the fan 20 to the mounting rack 12 of the first base 10.

The fin assembly 30 is disposed on the support plate 1274 of the bracket 127, adjacent to an air outlet (not shown) of the fan 20. The fin assembly 30 includes a plurality of stacked fins 32. An air channel 36 (shown in FIG. 6) is defined between every two adjacent fins 32. Each of the fins 32 is bent toward a lateral side thereof at one end away from the fan 20, with the air channel 36 between every two adjacent fins 32 forming a corresponding shape, thereby deflecting the airflow from its original direction to generate turbulent airflow. This reduces airflow retention on outer surfaces of the fins 32, and enhances heat transfer efficiency between the airflow and the fins 32. The fin assembly 30 defines a plurality of parallel and spaced accommodating holes 34 therein. The accommodating holes 34 extend through the fins 32. The tabs 1270 of the bracket 127 abut against two outermost fins 32, respectively, preventing lateral sliding of the fin assembly 30.

The heat pipe assembly 50 includes a plurality of first heat pipes 52 thermally connecting the first base 10 with the fin assembly 30, and a second heat pipe 54 thermally connecting the heat spreader 40 with the fin assembly 30. The first heat pipes 52 are generally U-shaped, and each includes an evaporation section 524, a condensation section 522, and an adiabatic section 526 interconnecting the evaporation section 524 and the condensation section 522. The second heat pipe 54 is flattened, and includes an evaporation section 544, a condensation section 542, and an adiabatic section 546 interconnecting the evaporation section 544 and the condensation section 542. The adiabatic section 546 of the second heat pipe 54 is longer than the adiabatic section 526 of each first heat pipe 52. The condensation sections 522, 542 of the first and second heat pipes 52, 54 are received in the accommodating holes 34 of the fin assembly 30, respectively. The evaporation sections 524 of the first heat pipes 52 are received in cylindrical receiving holes cooperatively formed by the receiving holes 140, 1220 of the top and bottom plates 14, 122 of the first base 10, respectively. The evaporation section 544 of the second heat pipe 54 is attached to a top surface of the heat spreader 40. The adiabatic sections 526, 546 of the first and second heat pipes 52, 54 are located beside the fan 20.

The heat spreader 40 is generally rectangular, and made of metal or metal alloy which has a high heat conductivity coefficient, such as copper, copper-alloy, or other suitable material. The heat spreader 40 is attached to the second electronic component 74 of the circuit board 70.

Figure 4:
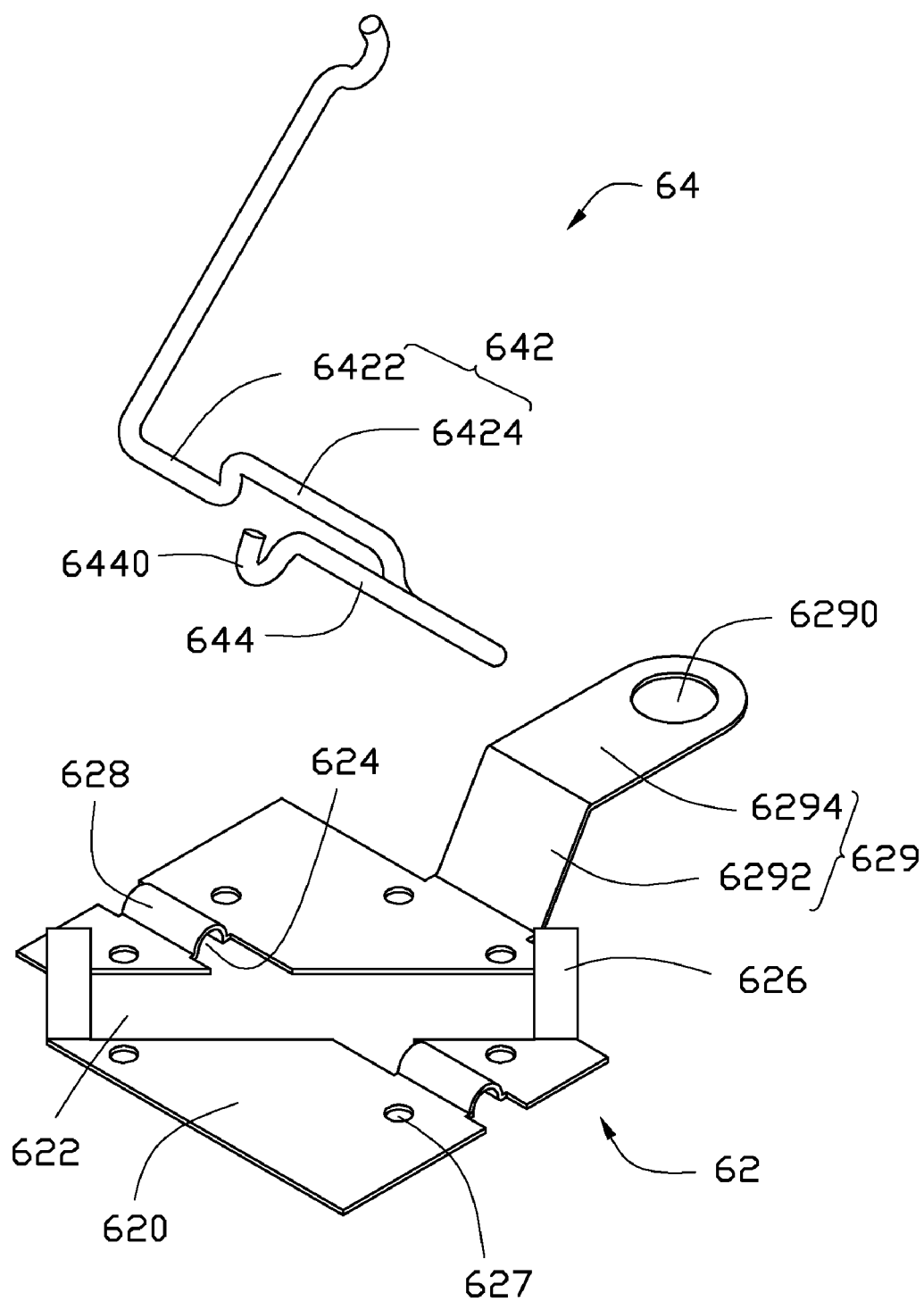
FIG. 4 is an enlarged, exploded view of a fastening assembly of the electronic system of FIG. 1.

Referring also to FIG. 4, the fastening assembly 60 includes a retention rack 62 mounting the evaporation section 544 of the second heat pipe 54 on the heat spreader 40, and a wire clip 64 securing the heat spreader 40 on the second electronic component 74. The retention rack 62 includes a retention plate 620, and a connecting portion 629 extending from the retention plate 620. The retention plate 620 is substantially rectangular, and defines an elongated opening 622 and a slot 624 crossing the opening 622. The opening 622 extends diagonally along the retention plate 620, defining two substantially triangular portions of the retention plate 620. The slot 624 extends along an axis perpendicular to opposite lateral sides of the retention plate 620, and divides each triangular portion of the retention plate 620 into two portions. The opening 622 is wider than the evaporation section 544 of the second heat pipe 54, and the slot 624 is wider the wire clip 64.

The retention plate 620 includes a pair of retaining portions 626 and a pair of fastening portions 628. The retaining portions 626 are saddle-shaped. The retaining portions 626 span the opening 622, and interconnect the triangular portions of the retention plate 620 divided by the opening 622. The fastening portions 628 are substantially semicylindrical. Considered another way, the fastening portions 628 are in the form of arc-shaped bridges. The fastening portions 628 span the slot 624, and interconnect the portions of the retention plate 620 divided by the slot 624. The retention plate 620 defines therein a plurality of rivet holes 627 beside the retaining portions 626, the fastening portions 628 and the connecting portion 629.

The connecting portion 629 is integrally formed with the retention plate 620 as a single piece. That is, the retention plate 620 is a single, one-piece monolithic body which includes the connecting portion 629. Alternatively, the connecting portion 629 can extend integrally from the heat spreader 40, or be welded or riveted on the heat spreader 40. The connecting portion 629 is moveably connected with the orienting portion 128 of the mounting rack 12. Namely, the retention rack 62 with the connecting portion 629 is moveable in a permitted range with respect to the orienting portion 128. In this embodiment, the connecting portion 629 is laminar, and includes an oblique portion 6292 extending obliquely upward from an edge of the retention plate 620, and a planar portion 6294 extending horizontally from a top end of the oblique portion 6292. A thickness of the planar portion 6294 is less than a height of the collar 1280 of the orienting portion 128. The planar portion 6294 defines a connecting hole 6290 in a distal end thereof. A diameter of the connecting hole 6290 is greater than an outer diameter of the collar 1280. The collar 1280 extends through the connecting hole 6290. A fastener 300 with a head 301 larger the connecting hole 6290 is received in the orienting hole 1282, for pivotally connecting the retention rack 62 of the second base with the first base 10. The planar portion 6294 of the connecting portion 329 is located between the orienting portion 128 and the head 301 of the fastener 300. Thus, the retention rack 62 is not only moveable up and down, but is also rotatable horizontally with respect to the collar 1280 of the first base 10.

The wire clip 64 is integrally made of a metal wire. The wire clip 64 includes a middle member 642, and two locking arms 644 extending perpendicularly and outwardly from opposite ends of the middle member 642 toward generally opposite directions. Each of the locking arms 644 forms a hook 6440 at a distal end thereof. The middle member 642 includes two abutting portions 6422, and a resisting portion 6244 interconnecting the abutting portions 6422. The resisting portion 6242 arches from two adjacent ends of the abutting portions 6422. The two locking arms 644 extending outwardly from two outer ends of the abutting portions 6422 toward generally opposite directions, respectively. The wire clip 64 is symmetrical with respect to the resisting portion 6244.

Figure 5:
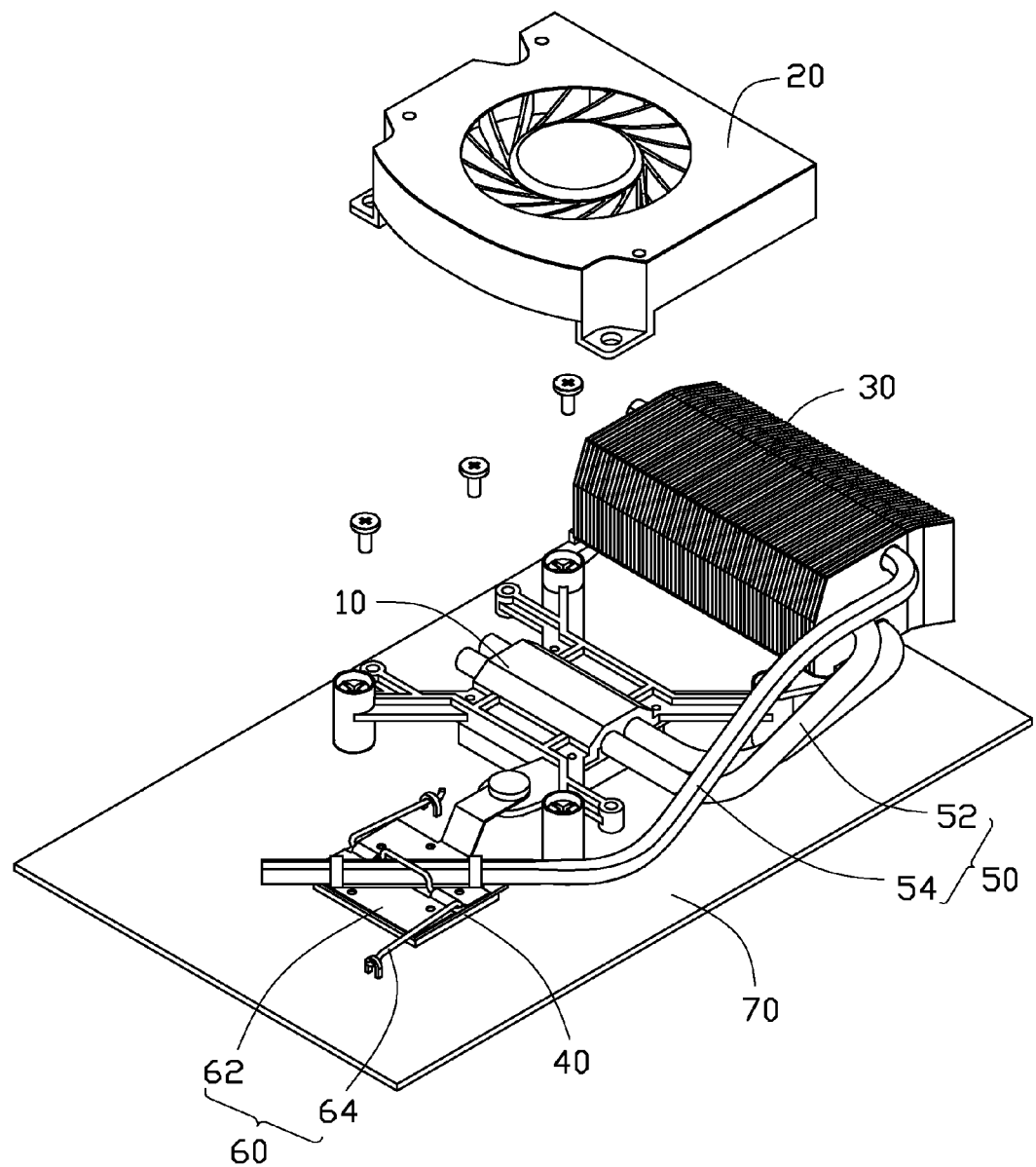
FIG. 5 is an isometric view of a fan disassembled from the electronic system of FIG. 1.
Figure 6:
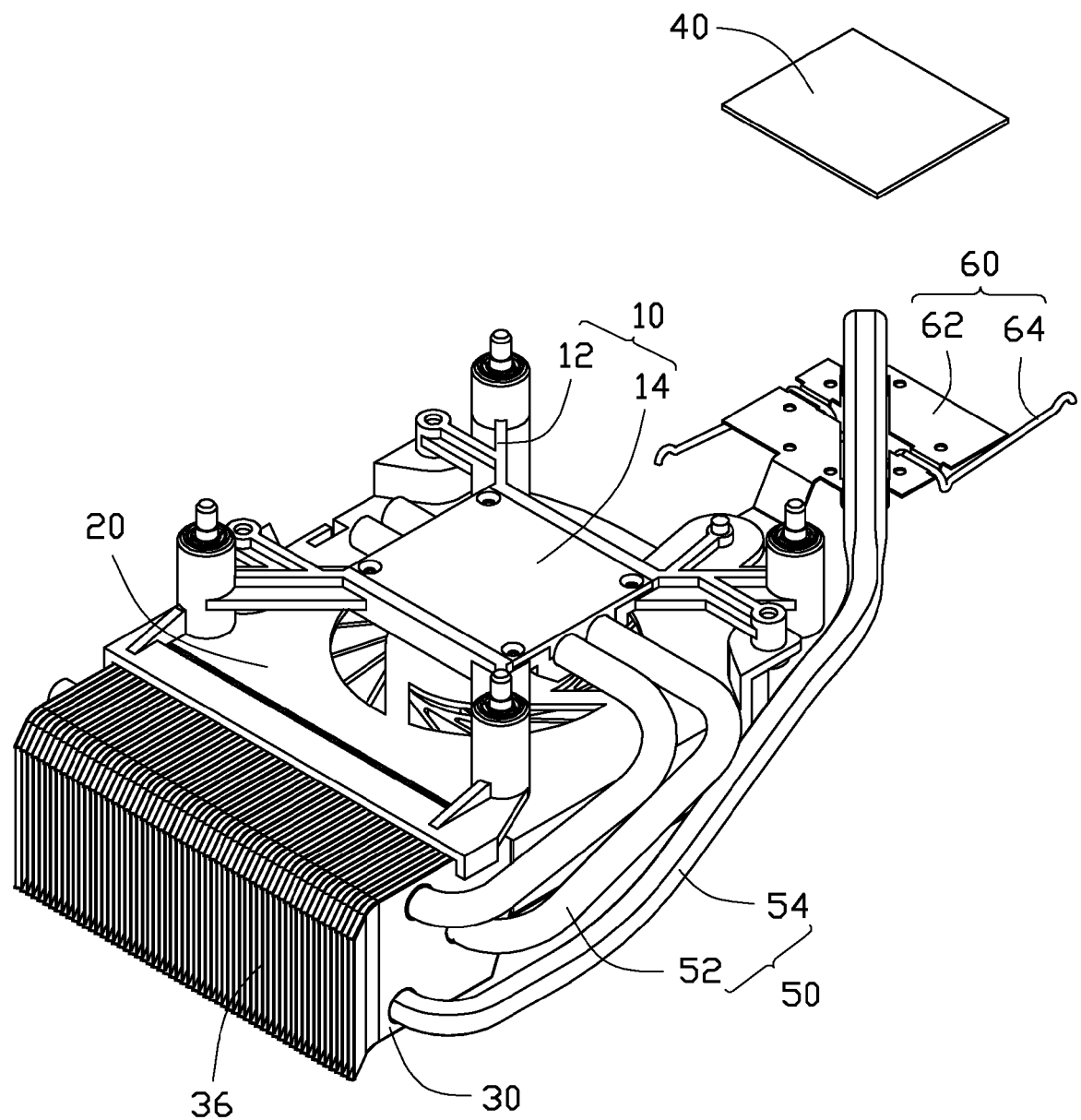
FIG. 6 is an inverted view of a heat spreader disassembled from a heat dissipation device of the electronic system of FIG. 1.

Referring also to FIGS. 5 and 6, the retention plate 620 of the retention rack 62 is riveted on the heat spreader 40 via the rivet holes 627, with the evaporation section 544 of the second heat pipe 54 and the abutting portions 6422 of the wire clip 64 respectively received in the opening 622 and the slot 624 of the retention plate 620. The retaining portions 626 of the retention plate 620 and the resisting portion 6244 of the wire clip 64 abut against a top surface of the evaporation section 544 of the second heat pipe 54, and the abutting portions 6422 of the wire clip 64 abut against inner surfaces of the fastening portions 628. The locking arms 644 of the wire clip 64 are pressed downward until the hooks 6440 of the locking arms 644 clasp the clasps 78 of the circuit board 70.

In the present heat dissipation device, the retention rack 62 of the second base is movably connected with the first base 10 via the connecting portion 629. Therefore, the second heat pipe 54 thermally connecting the second base with the fin assembly 30 does not deform easily during transport and assembly. In addition, there is required moveable space between the retention rack 62 of the second base and the first base 10 to meet product tolerances, such that a contact gap between the second heat pipe 54 and the heat spreader 40 is avoided. Thus, the heat dissipation efficiency of the heat dissipation device is enhanced.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device for a first electronic component and a second electronic component mounted on a circuit board, the heat dissipation device comprising:
    a first base configured to be mounted on the first electronic component; and
    a second base configured to be mounted on the second electronic component, the second base moveably connected with the first base wherein the first base is pivotally connected with the second base; wherein the first base comprises an orienting portion extending toward the second base, the second base comprises a connecting portion extending toward the first base, and the connecting portion is moveably connected with the orienting portion.

2. The heat dissipation device of claim 1, wherein the second base comprises a heat spreader and a fastening assembly configured for mounting the heat spreader on the second electronic component, and the connecting portion extends from one of the spreader and the fastening assembly.

3. The heat dissipation device of claim 1, wherein the orienting portion comprises an annular flange defining an orienting hole therein, the connecting portion defines a connecting hole therein, the flange extends through the connecting hole, and a fastener is received in the orienting hole thereby pivotally connecting the second base with the first base.

4. The heat dissipation device of claim 3, wherein the fastener comprises a head at a top end thereof, a thickness of the connecting portion is less than a height of the flange, a diameter of the connecting hole is greater than an outer diameter of the flange but less than an outer diameter of the head of the fastener, and the connecting portion is located between the orienting portion and the head of the fastener.

5. The heat dissipation device of claim 4, further comprising a fin assembly, a first heat pipe thermally connecting the first base with the fin assembly, and a second heat pipe thermally connecting the second base with the fin assembly.

6. The heat dissipation device of claim 5, further comprising a fan mounted on the first base, the fin assembly configured to be disposed at an air outlet of the fan, the fin assembly comprising a plurality of stacked fins, each of the fins bent toward a lateral side thereof at one end away from the fan.

7. The heat dissipation device of claim 5, wherein the first base comprises a bracket away from the second base, the fin assembly is disposed on the bracket, and the first and second heat pipes each comprise a condensation section received in the fin assembly.

8. The heat dissipation device of claim 7, wherein the bracket comprises two extension arms extending from the first base and a support plate connecting the extension arms, and a pair of tabs extend up from opposite ends of the support plate and abut against two outermost fins of the fin assembly, respectively.

9. The heat dissipation device of claim 8, wherein the first base further comprises a mounting rack and a bottom plate at a bottom of the mounting rack, the bottom plate is configured to be attached to the first electronic component, the mounting rack comprises a top plate and four fixing legs extending outwardly from four corners of the top plate, respectively, the top plate arches at a middle thereof, an evaporation section of the first heat pipe is received between the top and bottom plates, each of the fixing legs forms a mounting sleeve at a distal end thereof, and the extension arms of the bracket extend respectively from outer circumferential surfaces of two adjacent mounting sleeves of the fixing legs.

10. An electronic system, comprising:
    a circuit board comprising a first electronic component and a second electronic component;
    a first base mounted on the first electronic component; and
    a second base mounted on the second electronic component, the second base moveably connected with the first base wherein the first base comprises an orienting portion extending toward the second base, the second base comprises a connecting portion extending toward the first base, and the connecting portion is moveably connected with the orienting portion.

11. The electronic system of claim 10, wherein the second base comprises a heat spreader and a fastening assembly configured for mounting the heat spreader on the second electronic component, and the connecting portion extends from one of the spreader and the fastening assembly.

12. The electronic system of claim 10, wherein the orienting portion comprises an annular flange defining an orienting hole therein, the connecting portion defines a connecting hole therein, the flange extends through the connecting hole, and a fastener is received in the orienting hole thereby pivotally connecting the second base with the first base.

13. The electronic system of claim 12, wherein the fastener comprises a head at a top end thereof, a thickness of the connecting portion is less than a height of the flange, a diameter of the connecting hole is greater than an outer diameter of the flange, but less than an outer diameter of the head of the fastener, and the connecting portion is located between the orienting portion and the head of the fastener.

14. The electronic system of claim 13, further comprising a fin assembly, a first heat pipe thermally connecting the first base with the fin assembly, and a second heat pipe thermally connecting the second base with the fin assembly.

15. The electronic system of claim 14, wherein the first base comprises a bracket away from the second base, the fin assembly is disposed on the bracket, and the first and second heat pipes each comprise a condensation section received in the fin assembly.

16. The electronic system of claim 15, wherein the bracket comprises two extension arms extending from the first base and a support plate connecting the extension arms, and a pair of tabs extend upward from opposite ends of the support plate and abut against two outermost fins, respectively.

\* \* \* \* \*